US008463016B2

(12) United States Patent
Pang

(10) Patent No.: US 8,463,016 B2
(45) Date of Patent: Jun. 11, 2013

(54) EXTENDING THE FIELD OF VIEW OF A MASK-INSPECTION IMAGE

(75) Inventor: Linyong Pang, Los Gatos, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 532 days.

(21) Appl. No.: 12/701,420

(22) Filed: Feb. 5, 2010

(65) Prior Publication Data
US 2011/0194752 A1 Aug. 11, 2011

(51) Int. Cl.
*G06K 9/00* (2006.01)

(52) U.S. Cl.
USPC .......................................... 382/144; 382/141

(58) Field of Classification Search
USPC ................ 382/141–152, 154, 285, 100, 203, 382/254, 305, 276, 181, 211–214, 321, 108
See application file for complete search history.

(56) References Cited

U.S. PATENT DOCUMENTS

| | | | |
|---|---|---|---|
| 6,480,285 B1 | 11/2002 | Hill | |
| 6,484,306 B1 | 11/2002 | Bokor et al. | |
| 6,563,566 B2 | 5/2003 | Rosenbluth et al. | |
| 6,709,792 B2 | 3/2004 | Nakao | |
| 6,871,337 B2 | 3/2005 | Socha | |
| 6,873,720 B2 | 3/2005 | Cai et al. | |
| 6,925,202 B2 | 8/2005 | Karklin et al. | |
| 7,003,755 B2 | 2/2006 | Pang et al. | |
| 7,043,071 B2 | 5/2006 | Qian et al. | |
| 7,057,709 B2 | 6/2006 | Rosenbluth | |
| 7,093,226 B2 | 8/2006 | Pang | |
| 7,093,229 B2 | 8/2006 | Pang et al. | |
| 7,107,573 B2 | 9/2006 | Yamazoe et al. | |
| 7,124,394 B1 | 10/2006 | Abrams et al. | |
| 7,152,219 B2 | 12/2006 | Pang | |
| 7,178,127 B2 | 2/2007 | Abrams et al. | |
| 7,231,628 B2 | 6/2007 | Pack et al. | |
| 7,254,251 B2 | 8/2007 | Cai et al. | |

(Continued)

FOREIGN PATENT DOCUMENTS

| | | |
|---|---|---|
| WO | WO 2005/078528 A2 | 8/2005 |
| WO | WO 2005/078528 A3 | 8/2005 |
| WO | WO 2008/039674 A2 | 4/2008 |
| WO | WO 2008/039674 A3 | 4/2008 |

OTHER PUBLICATIONS

Chen, C. Y. et al, "Mask defect auto disposition based on aerial image in mask product", Proc. SPIE 7379, 73791F (2009).

(Continued)

*Primary Examiner* — Tri T Ton
(74) *Attorney, Agent, or Firm* — Wilson Sonsini Goodrich & Rosati

(57) ABSTRACT

A technique for determining photo-mask defect disposition is described. In this technique, a target mask pattern is used to expand an initial region in a photo-mask that is included in an initial mask-inspection image. In particular, a revised mask-inspection image that includes the initial region and a region surrounding the initial region is generated based on the initial mask-inspection image and the target mask pattern. Then a corresponding simulated mask pattern is calculated in an inverse optical calculation using the revised mask-inspection image and an optical model of the mask-inspection system. This simulated mask pattern is used to simulate a wafer pattern in a photo-lithographic process, and disposition of a possible defect in the initial region is subsequently determined based on the simulated wafer pattern and a target wafer pattern.

20 Claims, 10 Drawing Sheets

U.S. PATENT DOCUMENTS

| | | |
|---|---|---|
| 7,302,090 B2 | 11/2007 | Kalus et al. |
| 7,363,611 B2 | 4/2008 | Rosenbluth |
| 7,384,710 B2 | 6/2008 | Ogawa et al. |
| 7,403,649 B2 | 7/2008 | Cai et al. |
| 7,441,227 B2 | 10/2008 | Abrams et al. |
| 7,480,889 B2 | 1/2009 | Abrams et al. |
| 7,483,559 B2 | 1/2009 | Luk-Pat et al. |
| 7,557,921 B1 | 7/2009 | Adel et al. |
| 7,565,001 B2 | 7/2009 | Cai et al. |
| 7,571,423 B2 | 8/2009 | Abrams et al. |
| 7,617,474 B2 | 11/2009 | Pang et al. |
| 7,646,906 B2 | 1/2010 | Saidin et al. |
| 7,676,077 B2 | 3/2010 | Kulkarni et al. |
| 7,689,966 B2 | 3/2010 | Verma et al. |
| 7,695,876 B2 | 4/2010 | Ye et al. |
| 7,698,665 B2 | 4/2010 | Abrams et al. |
| 7,703,049 B2 | 4/2010 | Abrams et al. |
| 7,703,068 B2 | 4/2010 | Abrams et al. |
| 7,707,541 B2 | 4/2010 | Abrams et al. |
| 7,749,666 B2 | 7/2010 | Gassner et al. |
| 7,757,201 B2 | 7/2010 | Abrams et al. |
| 7,769,225 B2 | 8/2010 | Kekare et al. |
| 7,805,700 B2 | 9/2010 | Peng |
| 7,853,920 B2 | 12/2010 | Preil et al. |
| 7,921,383 B1 | 4/2011 | Wei |
| 7,984,391 B2 | 7/2011 | Abrams et al. |
| 7,992,109 B2 | 8/2011 | Abrams et al. |
| 7,995,832 B2 | 8/2011 | Xiong et al. |
| 8,056,021 B2 | 11/2011 | Abrams et al. |
| 8,057,967 B2 | 11/2011 | Ye et al. |
| 8,200,002 B2 | 6/2012 | Preil et al. |
| 8,204,295 B2 | 6/2012 | Preil et al. |
| 8,208,712 B2 | 6/2012 | Preil et al. |
| 8,260,032 B2 | 9/2012 | Preil et al. |
| 8,280,146 B2 | 10/2012 | Preil et al. |
| 8,285,030 B2 | 10/2012 | Zhou et al. |
| 8,331,645 B2 | 12/2012 | Preil et al. |
| 8,386,968 B2 | 2/2013 | Pang |
| 2002/0192578 A1 | 12/2002 | Tanaka et al. |
| 2003/0103189 A1 | 6/2003 | Neureuther et al. |
| 2003/0106642 A1 | 6/2003 | Fairbairn et al. |
| 2004/0008880 A1 | 1/2004 | Horie et al. |
| 2004/0265707 A1 | 12/2004 | Socha |
| 2005/0122500 A1 | 6/2005 | Ye et al. |
| 2005/0168498 A1 | 8/2005 | Granik |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0273242 A1 | 12/2006 | Hunsche et al. |
| 2007/0105029 A1 | 5/2007 | Ausschnitt |
| 2007/0133862 A1 | 6/2007 | Gold et al. |
| 2007/0198963 A1 | 8/2007 | Granik et al. |
| 2008/0152212 A1 | 6/2008 | Feldman |
| 2008/0170774 A1* | 7/2008 | Xiong et al. .......... 382/144 |
| 2008/0198350 A1 | 8/2008 | Sugita et al. |
| 2008/0241708 A1 | 10/2008 | Lin et al. |
| 2010/0135568 A1 | 6/2010 | Preil et al. |
| 2011/0022994 A1 | 1/2011 | Hu et al. |
| 2011/0194752 A1 | 8/2011 | Pang |
| 2011/0229805 A1 | 9/2011 | Wang et al. |
| 2012/0066651 A1 | 3/2012 | Pang et al. |
| 2012/0066652 A1 | 3/2012 | Clifford |
| 2012/0134542 A1 | 5/2012 | Pang et al. |
| 2012/0137260 A1 | 5/2012 | Pang et al. |
| 2012/0189187 A9* | 7/2012 | Preil et al. .......... 382/144 |
| 2013/0015350 A1 | 1/2013 | Chen et al. |

OTHER PUBLICATIONS

Daniel S. Abrams, Linyong Pang, "Fast Inverse Lithography Technology," *Proc. SPIE* vol. 6154, Optical Mirrolithography XIX, Mar. 15, 2006, pp.

Yuri Granik, "Solving Inverse Problems of Optical Microlithography," *Proc. SPIE* vol. 5754, Optical Microlithography XVIII, May 12, 2005, pp. 506-526.

Written Opinion issued by U.S. Patent and Trademark Office, mailed Mar. 25, 2008, in Luminescent Technologies, Inc. International Application No. PCT/US07/078913, "Photo-Mask and Wafer Image Reconstruction" filing date Sep. 19, 2007.

Response to Written Opinion filed Jul. 17, 2008, in Luminescent Technologies, Inc. International Application No. PCT/US07/078913, "Photo-Mask and Wafer Image Reconstruction" filing date Sep. 19, 2007.

Rosenbluth et al., "Optimum Mask and Source Patterns to Print Given Shape", Apr. 2002, SPIE Proceedings vol. 4346, pp. 13-30.

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

Pang, L. et al., "Computational Lithography & Inspection (CLI) and its Applications in Mask Inspection, Metrology, Review, and Repair," Luminescent Technologies Inc., Palo Alto, CA, Sep. 28, 2010.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Xiao et al., "Source Optimization and Mask Design to Minimize MEEF in Low $k_1$ Lithography" SPIE, vol. 7028, 11 pgs., (Jun. 9, 2008).

* cited by examiner

EXTENDING THE FIELD OF VIEW OF A MASK-INSPECTION IMAGE

BACKGROUND OF THE INVENTION

1. Field of the Invention

The present invention relates to systems and techniques for determining the disposition of potential defects in photo-masks for use in photo-lithography. More specifically, the present invention relates to systems and techniques for extending the field of view of mask-inspection images when determining the disposition of potential defects in photo-masks.

2. Related Art

Photo-lithography is a widely used technology for producing integrated circuits. In this technique, a light source illuminates a photo-mask. The resulting spatially varying light pattern is projected onto a photoresist layer on a semiconductor wafer by an optical system (referred to as an exposure tool). By developing the 3-dimensional pattern produced in this photoresist layer, a layer in the integrated circuit is created. Furthermore, because there are often multiple layers in a typical integrated circuit, these operations may be repeated using several photo-masks to produce a product wafer.

Unfortunately, as dimensions in integrated circuits steadily become a smaller fraction of the wavelength of the light used to expose images of the photo-mask onto the wafer, the structures in or on the ideal photo-mask (also referred to as the target mask pattern) and/or the physical structures in or on the actual photo-mask bear less and less resemblance to the desired or target wafer pattern on the wafer. These differences between the mask pattern and the target wafer pattern are used to compensate for the diffraction and proximity effects that occur when light is transmitted through the optics of the exposure tool and is converted into the 3-dimensional pattern in the photoresist.

From a photo-mask or reticle manufacturing standpoint, the increasing dissimilarity between the photo-mask and the corresponding wafer patterns creates a broad new class of problems in photo-mask inspection and qualification. For example, if a defect in a photo-mask is detected, it is often unclear what impact this defect will have on the final pattern in the photoresist. In addition, photo-mask inspection devices often have a different numerical aperture, different illumination configuration, different field of view (FOV), and even different light wavelength(s) than those used in the wafer exposure tool. As a consequence, the image measured by a photo-mask inspection tool is often neither a perfect replica of the physical photo-mask nor the mask pattern that will be exposed onto the wafer.

One existing approach to the former challenge uses a computer to simulate the resulting wafer pattern based on the inspection images of the photo-mask. By comparing simulations of wafer patterns corresponding to the ideal photo-mask (i.e., the target mask pattern) and an estimate of the actual photo-mask corresponding to the image of the photo-mask, the significance of the defect may be determined. However, because the image of the photo-mask may not be an accurate representation of the actual photo-mask, errors may be introduced when simulating wafer patterns, and thus, when trying to identify or classify defects. For example, the FOV in many mask-inspection systems is often too small. Consequently, when a resulting inspection image is subsequently used in simulations of a photo-lithographic process, the simulation accuracy can be degraded by optical proximity effects associated with the boundary of the inspection image. This may further complicate photo-mask inspection and qualification.

Similar issues arise when inspecting the patterned wafers. Hence, what is needed are photo-mask and patterned wafer inspection techniques that overcome the problems listed above.

SUMMARY OF THE INVENTION

The present disclosure relates to a computer system that determines a disposition of a possible defect in a photo-mask. During operation, the computer system receives a first image of a first region around the possible defect in the photo-mask, where the photo-mask corresponds to a target mask pattern. Then, the computer system generates a second image based on the first image, where the second image includes the first region and a second region surrounding the first region, and the second region is based on the target mask pattern. Moreover, the computer system calculates a simulated mask pattern based on the second image using an inverse optical calculation in which the second image is at an image plane in a model of an optical system and the simulated mask pattern is at an object plane in the model of the optical system. Furthermore, the computer system simulates a wafer pattern in a photo-lithographic process based on the simulated mask pattern. Next, the computer system determines the disposition of the possible defect based on the simulated wafer pattern and a target wafer pattern.

Note that generating the second region in the second image may involve filtering a portion of the target mask pattern based on an optical transfer function associated with the optical system. Moreover, if needed, generating the second region in the second image may involve averaging information in the first region in the first image with information in the second region at or proximate to a boundary between the first region and the second region, thereby ensuring a smooth transition between the information in the first region and the second region.

Furthermore, simulating the wafer pattern may involve a forward optical calculation in which the simulated mask pattern is at an object plane in a model of a photo-lithographic system and the simulated wafer pattern is at an image plane in the model of the photo-lithographic system. In some embodiments, simulating the wafer pattern involves simulating development of a photo-resist.

Additionally, determining the disposition may involve comparing the simulated wafer pattern and the target wafer pattern. For example, determining the disposition may involve identifying whether or not the possible defect is an actual defect based on the comparison. In some embodiments, determining the disposition involves calculating a manufacturing yield associated with the photo-mask and/or calculating a process window associated with the photo-mask.

Note that the optical system may include a photo-mask inspection system. Moreover, the first image may include information associated with a transmission imaging mode in the optical system.

Another embodiment provides a method that includes at least some of the operations performed by the computer system.

Another embodiment provides a computer-program product for use with the computer system. This computer-program product includes instructions for at least some of the operations performed by the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings. Moreover, multiple instances of the same part are designated by a common prefix separated from an instance number by a dash.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a technique for determining photo-mask defect disposition, and a computer program product (i.e., software) for use with the computer system are described. In this technique, a target mask pattern is used to expand an initial region in a photo-mask that is included in an initial mask-inspection image. In particular, a revised mask-inspection image that includes the initial region and a region surrounding the initial region is generated based on the initial mask-inspection image and the target mask pattern. Then a corresponding simulated mask pattern is calculated in an inverse optical calculation using the revised mask-inspection image and an optical model of the mask-inspection system. This simulated mask pattern is used to simulate a wafer pattern in a photo-lithographic process, and disposition of a possible defect in the initial region is subsequently determined based on the simulated wafer pattern and a target wafer pattern.

By expanding the initial region in the photo-mask that is included in the initial mask-inspection image in the subsequent simulation of the photo-lithographic process, the inspection technique can reduce or eliminate the optical-proximity-effects associated with the boundary of the initial region in the simulated wafer pattern. Consequently, the inspection technique can improve the accuracy of the disposition of possible defects in the photo-mask, which may improve photo-mask and/or wafer yield, thereby reducing manufacturing costs.

Figure 1:
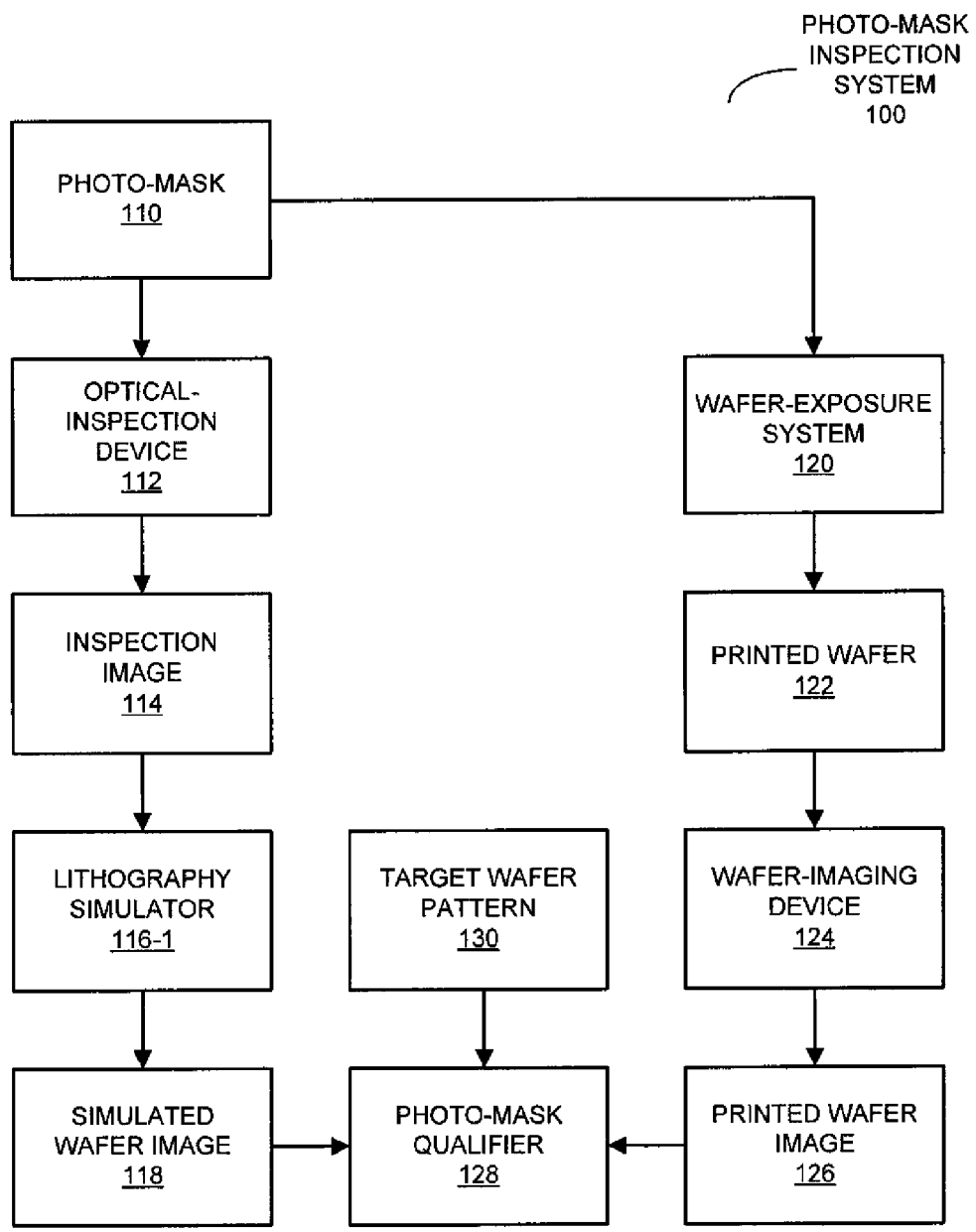
FIG. 1 is a block diagram illustrating an existing lithography-plane-based photo-mask inspection system.

We now describe embodiments of the technique. FIG. 1 presents a block diagram illustrating an existing lithography-plane-based photo-mask inspection system 100. In this photo-mask inspection system, an optical-inspection device 112 (such as the TeraScan™ photo-mask inspection system from KLA-Tencor, Inc., of San Jose, Calif.) determines an inspection image 114 of a photo-mask 110. Note that throughout the following discussion the inspection image 114, as well as any of the other images (such as reconstructed images) and/or patterns (such as mask patterns) described below, may be a bitmap or grayscale file that includes a set of values corresponding to pixels in an image. Furthermore, the quantization (i.e., the number of bits) in these image files may be varied, as needed, during the calculations that are described. Alternative formats having the same or similar information content, including a vector-based format such as Graphic Design System II (GDSII) and/or OASIS format may be used in some embodiments of the images and/or patterns (such as the target mask pattern or the target wafer pattern). And in some embodiments, the images include real and imaginary components (or equivalently, magnitude and phase information).

Using a lithography simulator 116-1 (which simulates a photo-lithographic process), a simulated or estimated wafer image 118 (i.e., an image of an estimated pattern that may be produced using an estimated photo-mask that corresponds to the inspection image 114) may be determined. In particular, simulated wafer image 118 may be determined when one or more features, such as one or more potential defects, are identified in inspection image 114. For example, a potential defect may be identified based on a difference between the target mask pattern and an estimated mask pattern corresponding to inspection image 114. (Alternatively or additionally, in aerial-image analysis, inspection image 114 is an intensity image at the same wavelength as in the photo-lithographic process, and therefore directly approximates simulated wafer image 118. Thus, simulations, measurements or both may be used to obtain simulated wafer image 118.)

Furthermore, photo-mask qualifier 128 may analyze the simulated wafer image 118 to determine if it is acceptable, i.e., if differences with respect to a target wafer pattern 130 and/or any defects that are present are within acceptable bounds, such as a fraction of a critical dimension (CD) in target wafer pattern 130. (Note that target wafer pattern 130 may correspond to at least a portion of an integrated circuit.) If yes, the photo-mask 110 may be accepted, and if not the photo-mask 110 may be rejected, subject to rework, or subject to additional qualification testing.

However, as noted previously, limitations in optical-inspection device 112 may result in differences between the simulated or estimated photo-mask that corresponds to inspection image 114 and photo-mask 110. As a consequence, analysis of simulated wafer image 118 may not be sufficient to determine if there are defects in photo-mask 110 and/or if defects that are detected are significant. Thus, the limitations of optical-inspection device 112 may gate the ability to qualify photo-masks, and may impact photo-mask and/or patterned wafer yields.

Alternatively or additionally, photo-mask 110 may be qualified based on comparisons between simulated wafer image 118 or target wafer pattern 130 and actual wafer patterns produced or generated using photo-mask 110. For example, a wafer-exposure system 120 (i.e., a photo-lithographic exposure tool) may be used to produce a printed wafer 122 using photo-mask 110, and a printed wafer image 126 of the pattern on printed wafer 122 may be determined using wafer-imaging device 124 (such as the PUMA™ patterned wafer-inspection platform from KLA-Tencor, Inc., of San Jose, Calif.). However, this brute-force approach is often expensive and time consuming. In addition, errors introduced in the photo-lithographic process in wafer-exposure system 120 may reduce the accuracy of the qualification decision made by photo-mask qualifier 128.

Figure 2A:
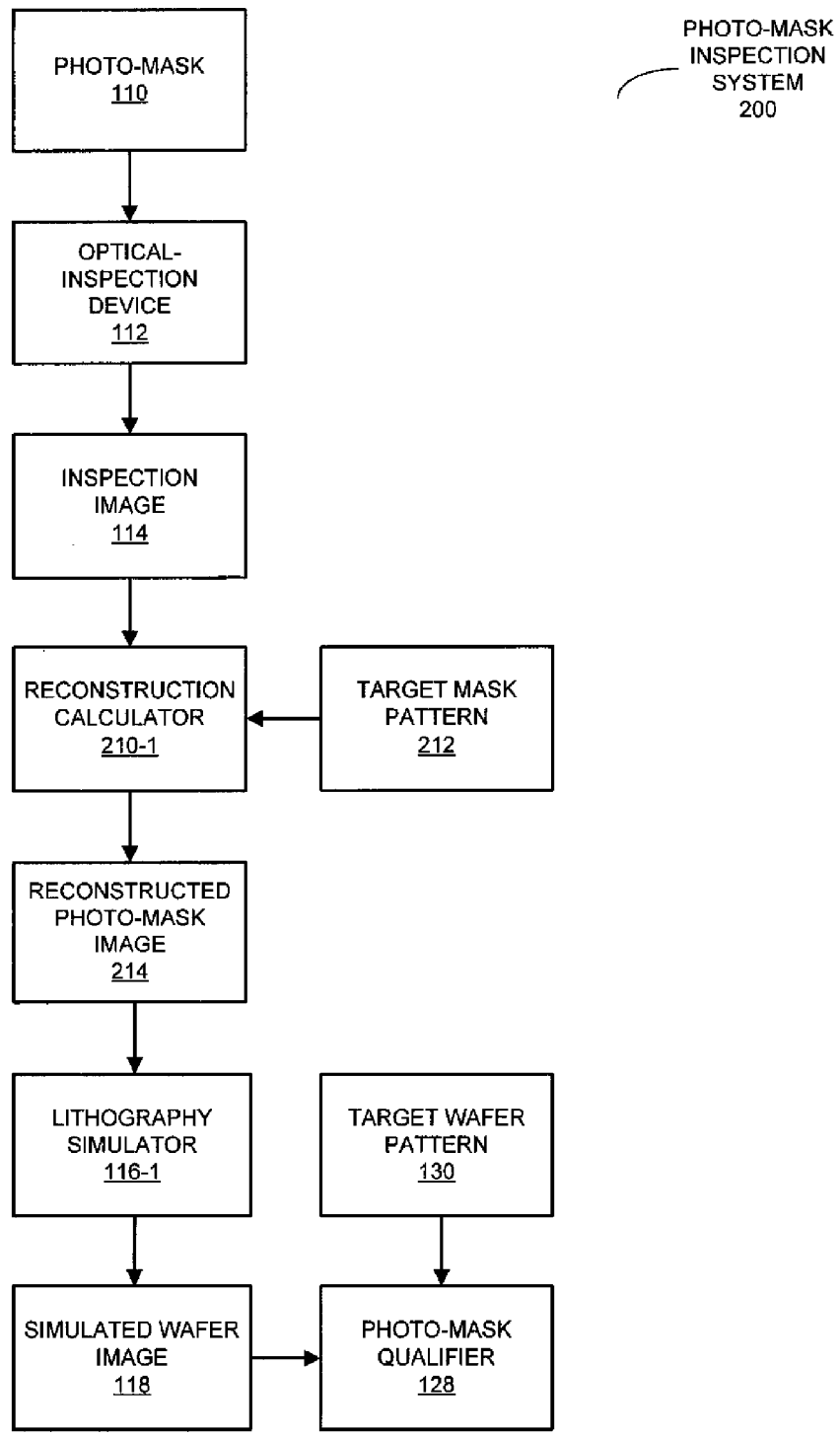
FIG. 2A is a block diagram illustrating a photo-mask inspection system in accordance with an embodiment of the present disclosure.

To address these problems, the inspection technique may be used. This is shown in FIG. 2A, which presents a block diagram illustrating a photo-mask inspection system 200. In this photo-mask inspection system, a reconstruction calculator 210-1 may determine a reconstructed photo-mask image 214 (i.e., a second image) based on a target mask pattern 212 and inspection image 114 (i.e., a first image). (Note that in some embodiments, patterns, such as target mask pattern 212, may have a document or file format that is similar to or the same as that for images, such as reconstructed photo-mask image 214.) Reconstructed photo-mask image 214 may correct for deficiencies in inspection image 114 (such as distortion or lost information associated with an optical path in optical-inspection device 112). In particular, as described below with reference to FIG. 3, reconstructed photo-mask image 214 may correct for a limited field of view (FOV) provided by optical-inspection device 112. By effectively increasing the size of the region in photo-mask 110 in reconstructed photo-mask image 214, optical proximity effects associated with a boundary of the region of photo-mask 110 in inspection image 114 in subsequent photo-lithography simulations (which are performed by lithography simulator 116-1) may be reduced or eliminated. Consequently, simulated wafer image 118 (based on an estimated photo-mask that corresponds to reconstructed photo-mask image 214) may be more accurate, which may allow photo-mask qualifier 128 to make more accurate qualification decisions, i.e., whether or not a potential defect in the region of photo-mask 110 in inspection image 114 is an actual defect, and thus whether or not photo-mask 110 is acceptable.

Figure 2B:
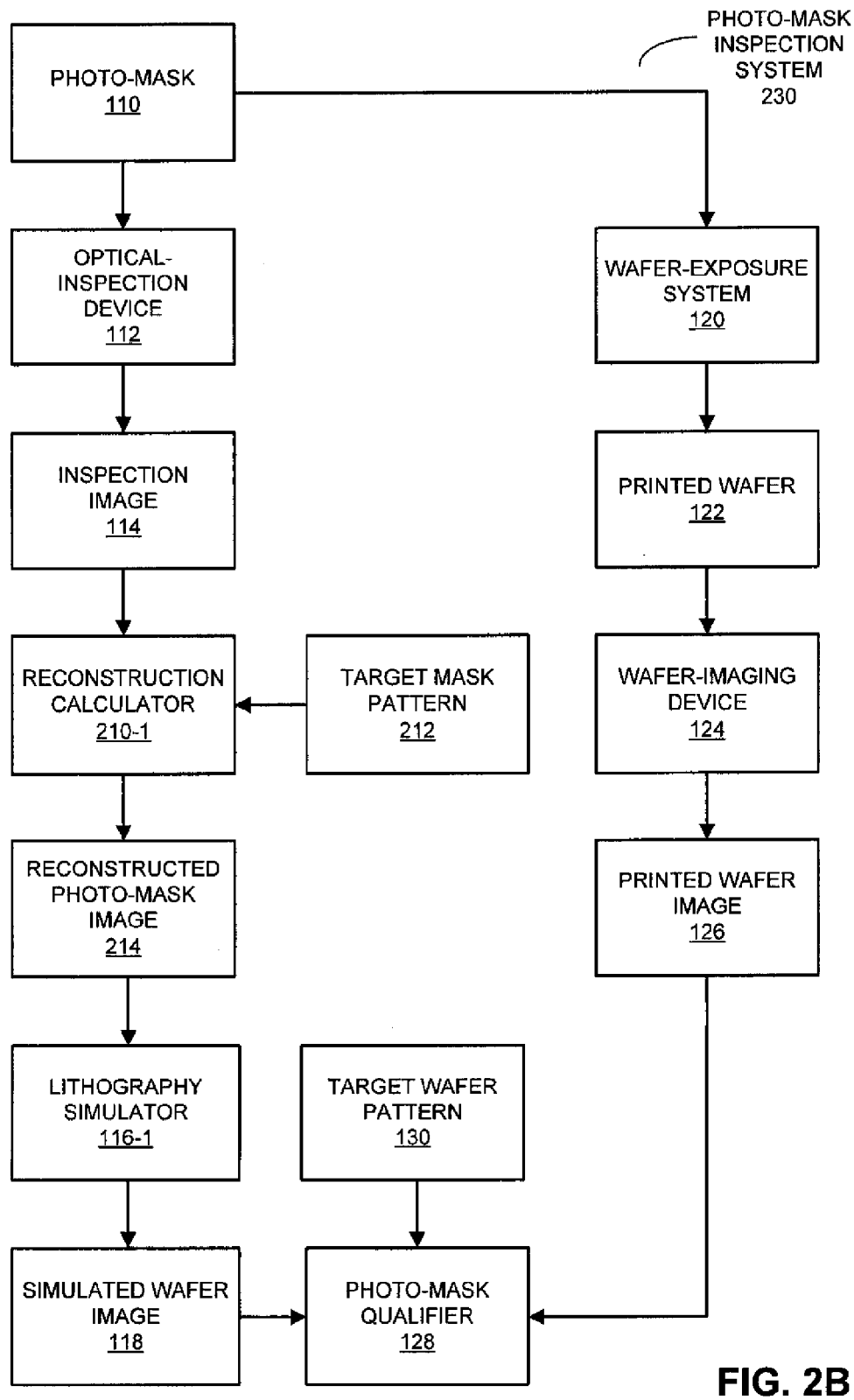
FIG. 2B is a block diagram illustrating a photo-mask inspection system in accordance with an embodiment of the present disclosure.
Figure 2C:
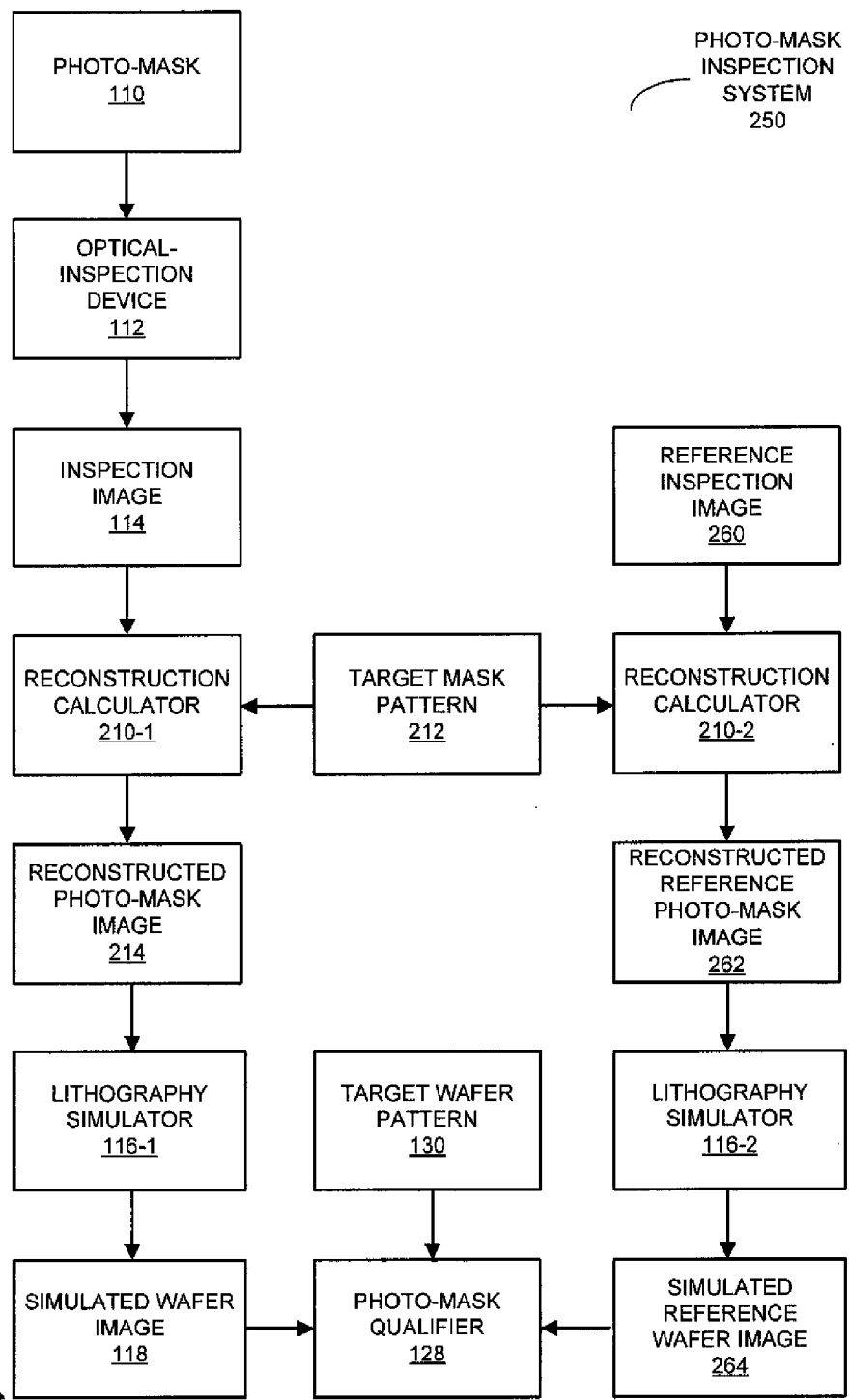
FIG. 2C is a block diagram illustrating a photo-mask inspection system in accordance with an embodiment of the present disclosure.

Note these qualification decisions may be based on comparisons between simulated wafer image 118 and target wafer pattern 130. Alternatively, as shown in FIG. 2B, which presents a block diagram illustrating a photo-mask inspection system 230, comparisons may be made between simulated wafer image 118 and printed wafer image 126. Furthermore, as shown in FIG. 2C, which presents a block diagram illustrating a photo-mask inspection system 250, comparisons may be made between simulated wafer image 118 and simulated reference wafer image 264 (which is calculated by lithography simulator 116-2 based on reconstructed reference photo-mask image 262, which in turn is generated by reconstruction calculator 210-2 based on reference inspection image 260 of at least a portion of the same or a different photo-mask or, optionally, on target mask pattern 212). (Note that comparisons based on reference inspection image 260 is sometimes referred to as die-to-database inspection.) In some embodiments, qualification decisions are also made based on comparisons between reconstructed photo-mask image 214 and another reconstructed photo-mask image (of the same or a different photo-mask), and/or comparisons between target mask pattern 212 and an estimated photo-mask corresponding to reconstructed photo-mask image 214.

Note that defects (or, more generally, features) in reconstructed photo-mask image 214 may be identified based on these comparisons, and photo-mask 110 may be accepted (or not) based on at least a subset of the identified defects. For example, photo-mask 110 may be accepted or rejected based on a type, severity, and/or number of defects (such as 1, 2, 5, 10, 25, 50, 100, 250, 500, and/or 1000 identified defects per photo-mask) that are identified. In addition, photo-mask 110 may be accepted or rejected based on an impact of such defects on yield.

In some embodiments, at least the subset of the defects is identified based on a set of pre-determined defects (such as known defects) and/or statistical properties of the set of pre-determined defects (such as their probabilities of occurrence). Furthermore, in some embodiments photo-mask 110 is accepted (or not) based on a process window (such as a range of exposure times, a depth of focus, a range of exposure intensities, and/or a normalized image log slope) for the simulated or estimated photo-mask corresponding to reconstructed photo-mask image 214 that is used in lithography simulator 116-1. In addition, in some embodiments photo-mask 110 is accepted (or not) based on defects identified over or throughout the process window, and/or based on an impact on a CD across the process window.

Figure 3:
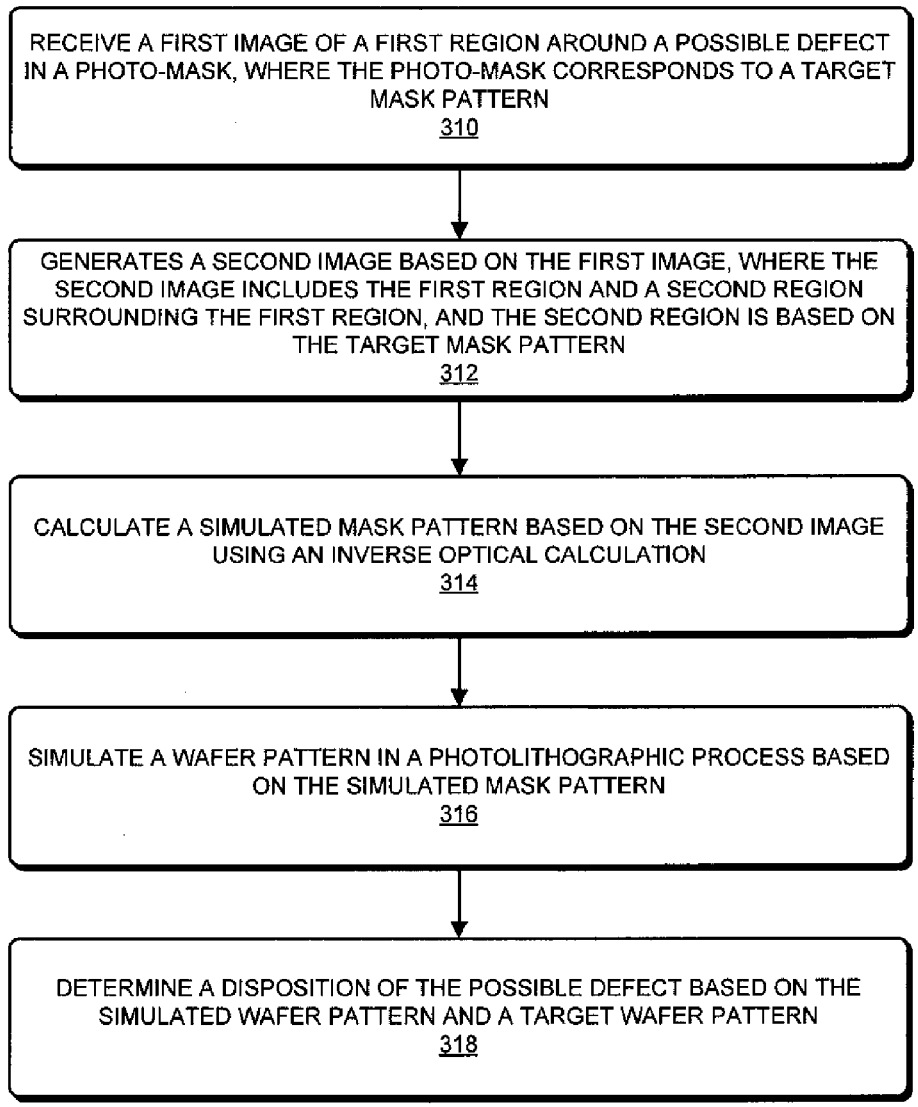
FIG. 3 is a flow chart illustrating a process for determining a disposition of a possible defect in a photo-mask in accordance with an embodiment of the present disclosure.
Figure 7:
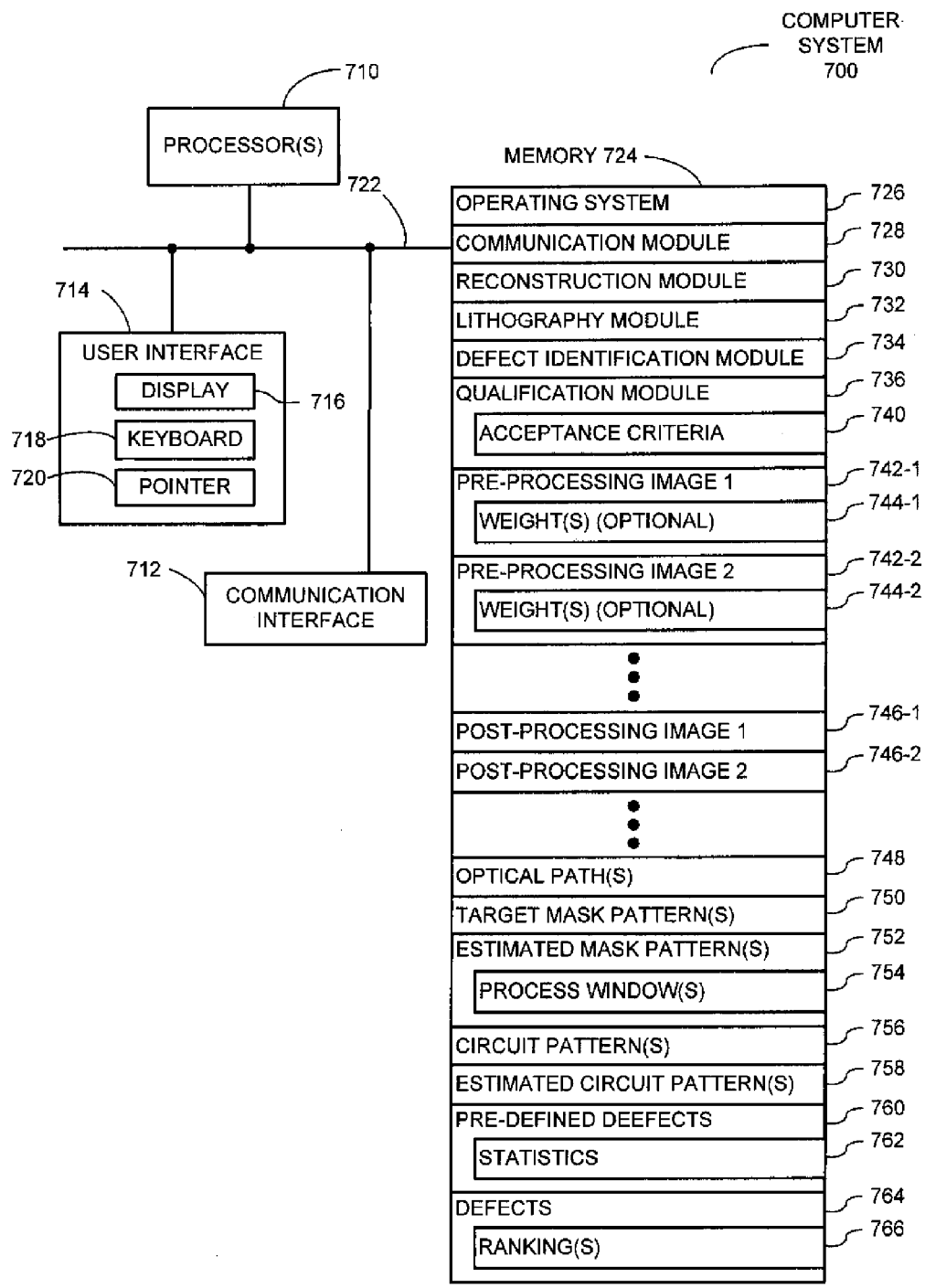
FIG. 7 is a block diagram illustrating a computer system in accordance with an embodiment of the present disclosure.

FIG. 3 presents a flow chart illustrating a process 300 for determining a disposition of a possible defect in a photo-mask, which may be performed by computer system 700 in FIG. 7. During operation, the computer system receives a first image of a first region around the possible defect in the photo-mask (operation 310), where the photo-mask corresponds to a target mask pattern. For example, the first image may include information associated with a transmission imaging mode in an optical system (such as that in a photo-mask inspection system). Then, the computer system generates a second image based on the first image (operation 312), where the second image includes the first region and a second region surrounding the first region, and the second region is based on the target mask pattern. Moreover, the computer system calculates a simulated mask pattern based on the second image using an inverse optical calculation in which the second image is at an image plane in a model of the optical system and the simulated mask pattern is at an object plane in the model of the optical system (operation 314). Furthermore, the computer system simulates a wafer pattern in a photo-lithographic process based on the simulated mask pattern (operation 316). Next, the computer system determines the disposition of the possible defect based on the simulated wafer pattern and a target wafer pattern (operation 318).

Note that generating the second region in the second image may involve filtering a portion of the target mask pattern based on an optical transfer function associated with the optical system. Moreover, if needed, generating the second region in the second image may involve averaging information in the first region in the first image with information in the second region at or proximate to a boundary between the first region and the second region.

Furthermore, simulating the wafer pattern may involve a forward optical calculation in which the simulated mask pattern is at an object plane in a model of a photo-lithographic system (such as the exposure tool that performs the photo-lithographic process) and the simulated wafer pattern is at an image plane in the model of the photo-lithographic system. In some embodiments, simulating the wafer pattern involves simulating development of a photo-resist.

Additionally, determining the disposition may involve comparing the simulated wafer pattern and the target wafer pattern. For example, determining the disposition may involve identifying whether or not the possible defect is an actual defect based on the comparison. In some embodiments, determining the disposition involves calculating a manufacturing yield associated with the photo-mask and/or calculating a process window associated with the photo-mask.

Note that in some embodiments of process 300 there are additional or fewer operations, the order of the operations may be changed, and two or more operations may be combined into a single operation. For example, as shown in FIGS. 2B and 2C, operation 318 may be modified so that disposition of the possible defect is based on the simulated wafer pattern and a printed wafer image and/or is based on the simulated wafer pattern and a simulated reference wafer image. Furthermore, simulations of the wafer pattern(s) in the photo-lithographic process based on the simulated mask pattern in operation 316 may be performed for a variety of scenarios, including out of focus conditions, dose variations, etc. In this way, it may be possible to determine that a potential defect is fatal when slightly overexposed, even though it has negligible effect at the nominal dose.

Figure 4:
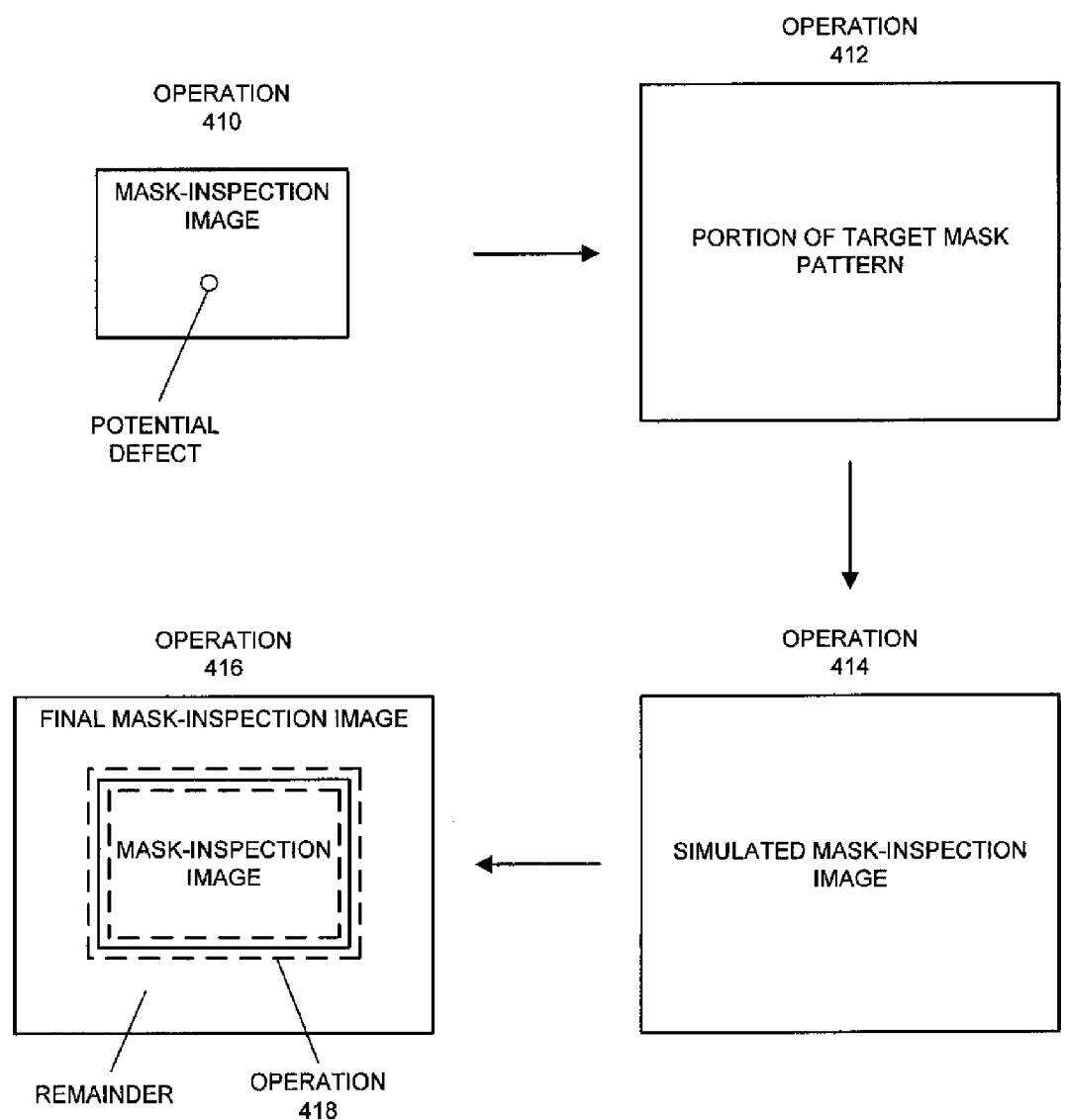
FIG. 4 is a flow chart illustrating a portion of the process of FIG. 3 in accordance with an embodiment of the present disclosure.

FIG. 4 presents a flow chart illustrating an exemplary embodiment of a portion of process 300 (FIG. 3). During this process, a potential defect may be identified in a mask-inspection image (operation 410), such as an aerial image of a region in a photo-mask. For example, the potential defect may be identified based on a CD comparison. In some embodiments different CD tolerances are used for defects that occur in different regions of a photo-mask or in different topologies in the photo-mask, such as: smooth region, corners, end-to-end, and/or end-to-smooth regions.

Then, based on the coordinate of the potential defect in the inspection image, the corresponding (large region) portion of the target mask pattern (such as a portion of a GDS file) may be selected (operation 412). Using this portion of the target mask pattern, a simulated mask-inspection image may be generated (operation 414). For example, the simulated mask-inspection image may be generated using the portion of the target mask pattern in a forward optical calculation based on a model of the optical path in the mask-inspection system.

Next, the mask-inspection image and the simulated mask-inspection image are aligned using an image alignment technique, such as one of the techniques known to one of skill in the art (operation 416). Furthermore, the area in the simulated mask-inspection image corresponding to region in the photo-mask may be replaced by the (measured) mask-inspection image to provide a final mask-inspection image (operation 416). Note that the final mask-inspection image is sometimes referred to as a 'reconstructed' image.

In some embodiments, the (measured) mask-inspection image and the remainder of the simulated mask-inspection image are merged (operation 418). For example, averaging or blending of the information in the two images may be performed in proximity to a boundary of the region in the photo-mask. In some embodiments, averaging may be monotonically decreased to zero over a distance from the boundary equal to 10% or 25% of a width of the region. Furthermore, the size of the remainder may correspond to an optical interaction length in the photo-lithographic process (which is determined, in part, by the optical wavelength, the numerical aperture of the optical path in the exposure tool that performs the photo-lithographic process, and the minimum CD). Thus, the size of the remainder may be selected so that optical proximity effects associated with the boundary of the region are reduced or eliminated in subsequent simulations of the photo-lithographic process.

Subsequently, a simulated or estimated mask pattern may be determined from the final mask-inspection image using an inverse optical calculation, and this estimated mask pattern may be used in simulations of the photo-lithographic process to determine one or more simulated wafer pattern(s). These simulated wafer pattern(s) may then be compared to a target wafer pattern, a patterned wafer and/or a simulated patterned wafer to determine if the potential defect results in a wafer pattern that is within acceptable bounds, i.e., to determine the disposition of the potential defect.

Figure 5A:
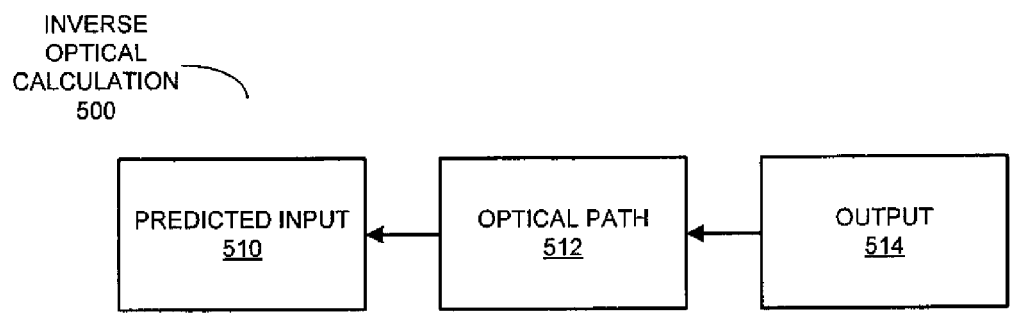
FIG. 5A is a block diagram illustrating an inverse optical calculation in accordance with an embodiment of the present disclosure.

As noted previously, the estimated mask pattern may be determined using an inverse optical calculation. This is illustrated in FIG. 5A, which is a block diagram of an inverse optical calculation 500. In the inverse optical calculation 500, a suitably illuminated predicted input 510 (such as the estimated mask pattern) is determined using an optical path 512 having an output 514 (such as reconstructed photo-mask image 214 in FIGS. 2A-2C) in one of its image planes. In particular, $$R = I^{-1} IM,$$

where I is a forward optical path operator (described in FIG. 5B below), $I^{-1}$ is an inverse optical path operator, M is the actual (physical) photo-mask pattern, and the application of I to M is the mask-inspection image or the printed-wafer image, and R is the reconstructed image. In the case of photo-mask inspection systems 200 (FIG. 2A), 230 (FIG. 2B) and 250 (FIG. 2C), optical path 512 corresponds to the optical-inspection device 112 (FIGS. 2A-2C). However, as noted below, in other embodiments optical path 512 corresponds to a wafer-imaging device. Furthermore, optical path 512 may include illumination and/or optical effects. Note that inverse optical calculation 500 is described further below.

The inverse optical calculation 500 may utilize more than one output. Using photo-mask inspection systems 200 (FIG. 2A), 230 (FIG. 2B) and 250 (FIG. 2C) as an illustration, two or more reconstructed photo-mask images (such as reconstructed photo-mask image 214 in FIGS. 2A-2C) may be used in lithography simulator 116-1 (FIGS. 2A-2C). For example, there may be two mask-inspection images (and, thus, two reconstructed photo-mask images) that are each determined using different wavelengths, different focal conditions (i.e., on different focal surfaces or planes), and/or different imaging conditions in optical inspection device 112 (FIGS. 2A-2C). These mask-inspection images may include intensity, magnitude and/or phase information. For example, images that include magnitude and relative phase information may be measured by generating an interference pattern using measurement and reference beams derived from a common light source or that are spatially and temporally coherent. Alternatively, phase contrast optics may be utilized. In some embodiments, the difference of two reconstructed photo-mask images corresponding to the mask-inspection images may be used as output 514 in inverse optical calculation 500. Furthermore, in some embodiments each of the reconstructed photo-mask images used in inverse optical calculation 500 or a term(s) including some combination of the reconstructed photo-mask images may be multiplied by a corresponding weight. In this way, the calculation (and thus, the results) may emphasize one or more of the reconstructed photo-mask images (and, thus, one or more of the mask-inspection images) relative to other reconstructed photo-mask images used in inverse optical calculation 500.

Figure 5B:
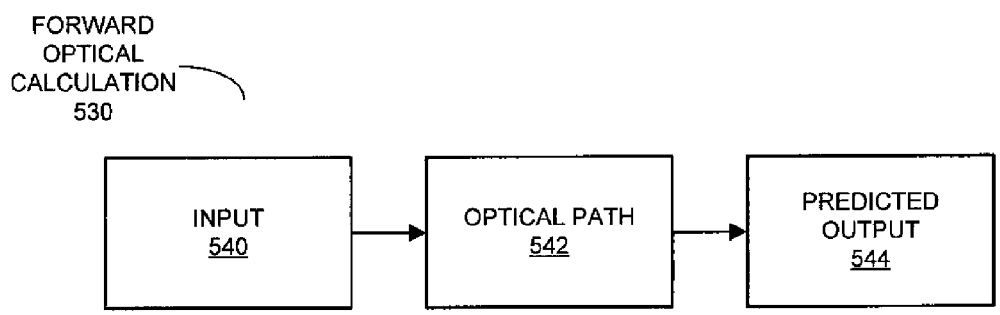
FIG. 5B is a block diagram illustrating a forward optical calculation in accordance with an embodiment of the present disclosure.

In another exemplary embodiment, simulated wafer image 118 (FIGS. 2A-2C) is determined using a forward optical calculation. This is illustrated in FIG. 5B, which is a block diagram of a forward optical calculation 530. In forward optical calculation 530, a predicted output 544 (such as simulated wafer image 118 in FIGS. 2A-2C) is determined using an optical path 542 having a suitably illuminated input 540 (such as an estimated mask pattern) at one of its object planes. In this case, optical path 542 corresponds to lithography simulator 116-1 (FIGS. 2A-2C) and may have a different numerical aperture, different illumination configuration, and/or a different wavelength(s) than that used in optical path 512 (FIG. 5A). Furthermore, in some embodiments optical path 542 may include some or all of the aspects of the photo-lithographic process, such as illumination settings, the electromagnetics of the photo-mask, the stepper optics, etc. Note that in some embodiments lithography simulator 116-1 (FIGS. 2A-2C) also includes a model of a photoresist used in a photo-lithographic process. And in some embodiments, lithography simulator 116-1 (FIGS. 2A-2C) includes flare and/or etch effects.

Note that calculations corresponding to one or more optical paths in an inverse optical calculation and/or a forward optical calculation may be implemented using Fourier-optical techniques. Furthermore, the optical paths in an inverse optical calculation and/or a forward optical calculation may include multiple models of optical paths, such as when inspection images from two or more different optical-inspection devices and/or wafer-imaging devices are used to determine a reconstructed image. Also note that while optical path 512 (FIG. 5A) and optical path 542 have been traversed in particular directions, each of these optical paths may be traversed in either direction.

As noted previously, while these optical calculations and the image processing techniques have been discussed in the context of photo-mask inspection, the inspection technique may be applied in wafer inspection, and in particular, to patterned-wafer inspection, thereby correcting for deficiencies in inspection wafer images (such as defocus, aberrations, limited FOV and/or lost information due to limitations of the wafer-imaging device) and improving the accuracy of the resulting qualification decisions. Thus, in some embodiments a reconstructed wafer image may be generated from an inspection wafer image of a printed or patterned wafer, and this reconstructed wafer image may be compared to a target wafer image, a printed wafer image and/or a simulated wafer image. Based on the wafer inspection, the wafer may be accepted or rejected, and/or the photo-lithographic process may be revised.

It will be recognized by one of ordinary skill in the art that inverse optical calculation 500 described above in FIG. 5A is ill defined. In particular, numerous possible estimated mask patterns may result in the same reconstructed photo-mask image 214 (FIGS. 2A-2C). Therefore, as noted above the estimated mask pattern may be selected such that it is 'most likely' to represent the reconstructed photo-mask image. A variety of constraints and additional criteria may be imposed when determining the solution(s) to this problem in order to find a unique answer(s). For example, estimated mask patterns that, when projected through the optical path of optical inspection device 112 (FIGS. 2A-2C), correspond to reconstructed photo-mask image 214 (FIGS. 2A-2C) are more likely to represent the actual photo-mask than other mask patterns (i.e., has the smallest value of the error function).

Because defects are not part of the design data (i.e., the mask pattern or the target wafer pattern), a certain degree of ambiguity will also exist when determining the exact geometric configurations and phases of the defects. Using a dark-field image as an example, in the limit of very small defects below the resolution limit of optical-inspection device 112 (FIGS. 2A-2C) or wafer-imaging device 124 (FIG. 2B), the defects may be imaged as small gray dots. The amount of light transmitted by such defects may provide an indication of the defect size, but approximately the same amount of transmission may be achieved by a more opaque defect of a larger size or by a more transparent defect of a smaller size.

It is possible to resolve some of this uncertainty as to the exact nature of the defect by collecting inspection images or printed-wafer images at multiple focus settings and programming the inverse optical calculation to determine the optimum photo-mask or wafer pattern that would most closely replicate the measured defects as a function of focus. In addition, the ambiguity may be resolved by optimizing over several optical paths, including several illumination configurations for each path (thus, in general, multiple inspection images may be used, including images from different optical-inspection devices and/or wafer-imaging devices). For example, a transmitting defect on the surface of a chromium-on-glass photo-mask that results in a phase shift may be determined. In addition, other parameters of optical-inspection device 112 (FIGS. 2A-2C) or wafer-imaging device 124 (FIG. 2B) may be varied or modified, including the illumination and projection optics configurations, in order to produce mask-inspection images that may be used in another inverse optical calculation in which a reconstructed photo-mask image is obtained from the mask-inspection images. In all combinations of such conditions, the goal of the inversion optical calculation is to find the unique solution that simultaneously minimizes the difference between the measured mask-inspection images or the measured printed-wafer images and the images that result when the reconstructed images are projected through the optical path of optical inspection device 112 (FIGS. 2A-2C) or wafer-imaging device 124 (FIG. 2B).

However, even with the use of multiple imaging conditions, some ambiguity may still remain in determining the exact size, shape, phase, and/or attenuation of one or more of the defects. As noted previously, in some embodiments of photo-mask inspection, the reconstructed image that is used to determine (via a corresponding estimated photo-mask in a forward optical simulation) an estimated wafer pattern or simulated wafer image may be that which, when projected through the optical path of the optical-inspection device 112 (FIGS. 2A-2C), is the closest match or one of the closest matches to the mask-inspection image or the printed-wafer image. Furthermore, this reconstructed photo-mask may also provide a worst-case estimate of the defects across the process window.

Other constraints based on a priori knowledge of the photo-mask or wafer manufacturing process may also be applied to resolve the ambiguity among several competing candidate defect possibilities. For example, there may be a priori knowledge about typical defect types (including the distribution of defect sizes and phases) that arise during the photo-mask or patterned-wafer manufacturing process. In addition, information may also be obtained from neighboring defects on the photo-mask or patterned wafer that is being inspected, or from previous photo-masks or patterned wafers that were manufactured on the same process line and inspected. For example, given the likelihood that point defects tend to be generated by common mechanisms, a common link between more than one such defect may constrain the possible solution options in the other inverse optical calculations.

One common type of defect is known as a CD defect or a sizing error. This type of defect is not an isolated feature (i.e., a feature where one does not belong), or a missing feature (i.e., where one was expected), but rather an error in the dimension of the feature being patterned on the photo-mask or the patterned wafer. Given the often blurry grayscale inspection images or printed-wafer images, it may be difficult for a user or operator to resolve these defects manually (i.e., to identify the defects in the mask-inspection images or printed-wafer images). In addition, the large mask error enhancement factors (MEEFs) of leading-edge lithographic processes makes it important to understand how such observed CD defects on or in photo-masks impact wafer manufacturing (i.e., the printed wafer patterns). The present invention is well suited to identifying and assessing the impact (i.e., the significance) of these and other defects in the photo-masks and patterned wafers.

We now further discuss exemplary embodiments of an inverse optical calculation to determine a reconstructed image. The inverse optical calculation may be based on minimization of an error function (which is also sometimes referred to as a cost function or a Hamiltonian function). Referring to FIGS. 2A-2C, during each iteration of the calculation the error function may be a function of the difference between an image that results when reconstructed photo-mask image 214 is projected through the optical path of optical inspection device 112 and estimated mask pattern. In some embodiments, the estimated mask pattern initially corresponds to the target mask pattern, and as the calculation progresses the estimated mask pattern is allowed to evolve while reconstructed photo-mask image 214 is held constant. Including multiple inspection images, in some embodiments the error function (If) equals $$\sum_{j=1}^{N} w_j |I_j - I_{oj}|^n,$$

where $I_j$ is the forward projection of the jth estimated mask pattern (out of N estimated mask patterns in this example) through the optical path, $w_j$ is a corresponding weight, $I_{oj}$ is the jth reconstructed photo-mask image (or the jth printed-wafer image), and n is a power. Note that the error function (H) approaches zero as $I_f$ approaches $I_{oj}$.

In an exemplary embodiment, N is 3 and n is 2. The 3 reconstructed photo-mask image may be determined at 3 different focal planes (or focus settings) in optical-inspection device 112 (FIGS. 2A-2C). For example, with a wavelength of 260 nm, the focal planes may be at −600 nm (relative to nominal focus), at 0 nm (i.e., at nominal focus), and 600 nm (relative to nominal focus). Alternatively or in addition, the 3 reconstructed photo-mask image may be determined at three different wavelengths or imaging conditions. Furthermore, a corresponding set of weights $\{w_j\}$ may be 1, 0.1, and 1.

In other embodiments, the weights are varied as the inverse optical calculation progresses and/or different weights are used for specific parts (or even pixels) of an image. For example, the weights may be determined based on the difference between $I_j$ and $I_{oj}$ at a given point in the calculation. This approach may exaggerate the features or defects, especially when the calculation is close to a local or global minimum and the error function (H) corresponds to small differences. Thus, in general the error function (H) may be expressed as a double integral over the reconstructed photo-mask image area and there may be separate time-dependent weights for $I_j$ and $I_{oj}$. Furthermore, in some embodiments the error function (H) is expressed as a relative difference between $I_j$ and $I_{oj}$ for at least a portion of the calculation as it progresses.

We now describe an exemplary embodiment of the forward projection used when determining the error function or simulated wafer image 118 (FIGS. 2A-2C). For simplicity, coherent illumination of the estimated mask pattern is utilized. Furthermore, the electric field falling upon the estimated mask pattern is approximately constant. Thus, the clear regions of the estimated mask pattern pass the light, while the opaque regions block the light. It follows that a scalar electric field E, just behind the estimated mask pattern, may be expressed as $$E(\vec{r}) = \begin{Bmatrix} 0 & \text{chrome} \\ 1 & \text{glass} \end{Bmatrix},$$

where $\vec{r}=(x, y)$ is a point on the (x,y) plane. As described further below with reference to FIG. 6, this representation of the estimated mask pattern may be re-expressed using a function $\phi$ (referred to as a level-set function) having positive regions that indicate glass and negative regions that indicate chrome. Furthermore, the level-set function may equal zero at the boundaries or contours of the estimated mask pattern). Therefore, the electric field E associated with the estimated mask pattern may be re-expressed as a function of this level-set function, i.e., $$E(\vec{r}) = \hat{h}(\phi(x,y)),$$

where $\hat{h}$ is the Heaviside function $$\hat{h}(x) = \begin{Bmatrix} 1 & x \geq 0 \\ 0 & x < 0 \end{Bmatrix}.$$

Because an ideal diffraction limited lens acts as a low-pass filter, this may be used as an approximation to the actual (almost but not quite perfect) lens in the optical path of the optical-inspection device or the exposure tool (in this example). Mathematically, the action of the lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x,k_y) = \hat{h}(k_{max}^2 - [k_x^2 + k_y^2]) = \begin{cases} 0 & k_x^2 + k_y^2 \ge k_{max}^2 \\ 1 & k_x^2 + k_y^2 < k_{max}^2 \end{cases},$$

wherein $k_x$, $k_y$, and $k_{max}$ frequency coordinates in Fourier space. Therefore, the aerial image at the wafer or the inspection image (at the detector) is simply the square of the electric field $$I(\vec{r}) = |A(\vec{r})|^2.$$

Combining these two equations, we find $$F(\phi(x,y)) = (|f^{-1}(\hat{C}(f(\hat{h}(\phi(x,y)))))|^2).$$

This is a self-contained formula for the image seen by the wafer or the optical-inspection device (or, in alternate example, by the wafer-imaging device).

Note that this is just one embodiment of the forward projector that can be used within the scope of this invention, chosen by way of example due to its relative simplicity. More sophisticated forward models also fall within the scope of the present invention. Such models may take into account, by way of example but not limitation, various illumination conditions (e.g., off-axis, incoherent), the actual electromagnetics of the light field interacting with the photo-mask, various types of photo-masks other than chrome on glass (e.g., attenuated phase shifting, strong phase shifting, other materials, etc.), the polarization of the light field, the actual properties of the lens (such as aberrations), and/or the vector nature of the electromagnetic field as it propagates through the optical path.

Figure 6:
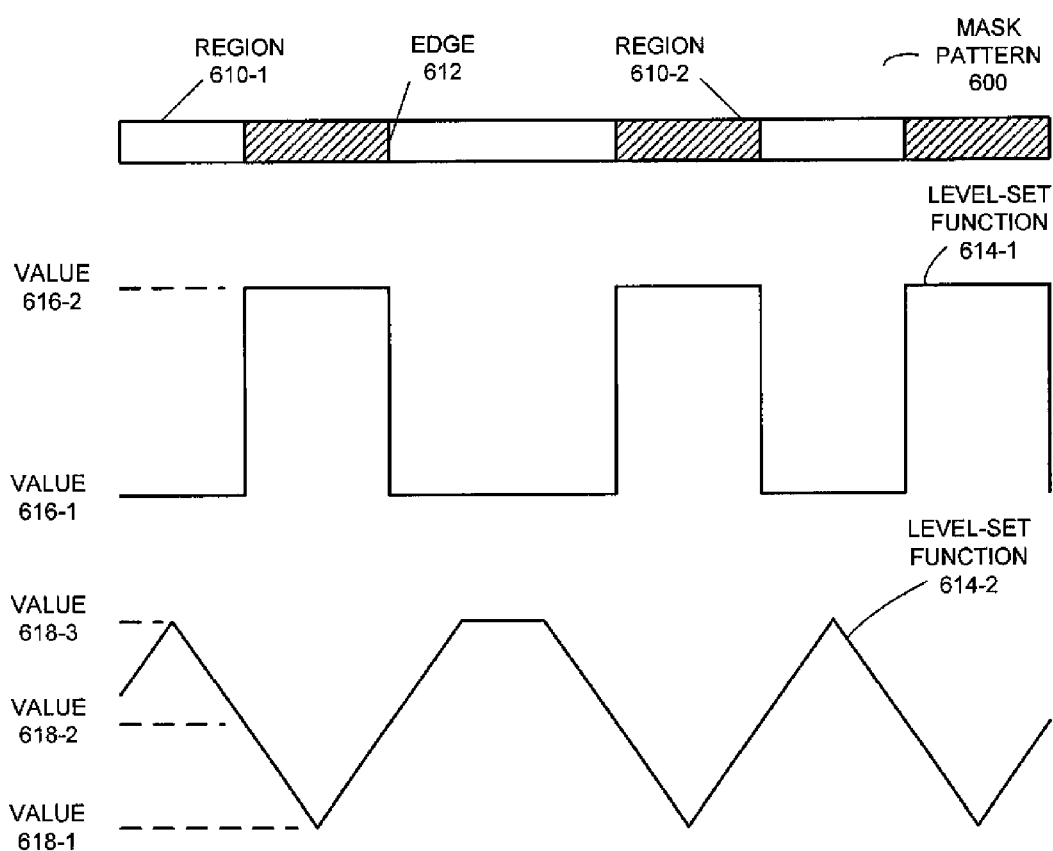
FIG. 6 is a diagram illustrating a mask pattern and corresponding level-set functions in accordance with an embodiment of the present disclosure.

We now describe the level-set functions in more detail. In the inverse optical calculation, the estimated mask pattern(s) being modified may be represented as a function having a set of values that is larger than those in the reconstructed photo-mask images or the printed-wafer images. As discussed previously, in one embodiment the function is a level-set function. This is illustrated in FIG. 6, which provides a mask pattern 600 and corresponding level-set functions 614. Mask pattern 600 includes alternating regions with glass (610-1) and chromium (610-2). Transitions from one region to another are characterized by a contour or an edge, such as edge 612. When viewed from a direction perpendicular to a plane of the photo-mask, edge 612 defines mask pattern 600.

Level-set function 614-1 has two values 616. Edge 612 may correspond to a mid-point between these two values 616. In contrast, level-set function 614-2 has three values 618, and edge 612 may correspond to value 618-2. While not illustrated in FIG. 6, level-set functions 614 extend into the plane of FIG. 6 (i.e., they are 3-dimension functions). As is known to one of skill in the art, there are many alternate level-set functions and/or configurations that may be used. For example, in some embodiments one or more separate level-set functions and/or separate images may be used for the features or defects.

As illustrated by level-set function 614-2, in some embodiments the level-set function may be expressed as a signed distance function relative to the contour or edge 612 (i.e., the value of the level-set function in at least a region is a function of the distance from edge 612). This formulation may allow effects that occur nearer to edge 612 (such as CD defects) to be highlighted. However, because features or defects in photo-masks and patterned wafers may occur at random locations (including those far removed from edge 612), level-set function 614-1 may be useful in that it provides an equal weighting with respect to edge 612.

In some embodiments, during each iteration of the inverse optical calculation the level-set function corresponding to one of the estimated mask patterns being modified is updated according to $$\phi_{i+1} = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the error function. In an exemplary embodiment, $\nabla(H)$ is $$\left.\frac{\delta H}{\delta \phi}\right|_{\varphi_i},$$

i.e., it is the Frechet derivative of the error function H. Furthermore, in some embodiments $\nabla(H)$ is the direction of steepest descent for minimizing or optimizing H by changing $\phi$. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of the inverse optical calculation. In particular, the error function H may be allowed to increase during some steps as the calculation evolves. In this way, the global minimum in the multi-dimensional space may be determined. Note that the size of this multi-dimensional space corresponds to a number of quantization levels to the power of the number of pixels in the estimated mask pattern. In an exemplary embodiment, these images have at least 1 million pixels (for example, 1024×1024).

In one embodiment, in any iteration of the calculation changes in $\phi$ that decrease or increase the error function up to 0.5% are performed. If a larger change will result (i.e., $\Delta H > 0.5\%$), the step size $\Delta t$ is decreased by a factor that is at least greater than 1 and the change in $\phi$ is implemented (or not) based on a probability and a value P given by $$e^{\frac{-kH_{i+1}}{H_i}},$$

where $H_{i+1}$ is the error function in the $i+1^{th}$ iteration (if the change in $\phi$ is implemented) and $H_i$ is the error function in $i^{th}$ iteration (note that the ratio of $H_{i+1}/H_i$ equals $1+\Delta H$). In some embodiments k is 0.155. For example, if the value P is 0.3 and a random number between 0 and 1 is less than P, the error function is increased before proceeding. In this way, the inverse optical calculation initially takes large steps and thereby explores the solution space.

Furthermore, in some embodiments, the inverse optical calculation is divided into a series of overlapping sub-problems (also referred to as work units) at least some of which are processed independently and/or concurrently. These work units may be based on elements or structures (for example, repetitive structures) in the target mask pattern, the target wafer pattern, and/or in one or more of the mask-inspection images or printed-wafer images. In some embodiments, the works units are selected such that there is a probability exceeding a pre-defined value (i.e., a high probability) that most if not all of the work units include at most one defect (for example, the work units may be based on differences between a mask-inspection image and a simulated inspection image that is determined using a target mask pattern). Furthermore, in some embodiments the work units may partially overlap neighboring work units. For example, the work units may be between 10,000 nm² and 100 µm² in size.

In some embodiments, the inverse optical calculation is run for 100, 1000 or 10,000 iterations at which point the optimal solution has been determined. In other embodiments, the calculation is stopped based on convergence criteria, such as oscillatory behavior, a relative and/or absolute difference between the reconstructed photo-mask image and the images that result when the estimated mask pattern is projected through the optical path of optical inspection device 112 (FIGS. 2A-2C), the latest change to the error function H, and/or the history of changes to the error function H. For example, the relative difference may be less than 1% and/or the absolute difference may be 10 nm for a CD of 100 nm. Note that in some embodiments, the level-set function is re-distanced (i.e., restored to one having the distance function property relative to edge 612) at intermediate iterations during the calculation. In an exemplary embodiment, such re-distancing occurs at least every 20 iterations (for example, every 14 iterations).

Using this inverse calculation approach, features smaller than the wavelength of the light source used to perform optical measurements or to print wafer patterns in a photo-lithographic process may be determined. For example, in simulations of the other inverse optical calculation using a light source having a wavelength of 260 nm, features and defects as small as $(10\ nm)^2$ on a patterned wafer or as small as $(40\ nm)^2$ on a photo-mask were determined.

We now discuss computer systems for implementing image reconstruction and photo-mask and/or patterned wafer qualification. FIG. 7 provides a block diagram illustrating a computer system 700. This computer system includes one or more processors 710, a communication interface 712, a user interface 714, and one or more signal lines 722 coupling these components together. Note that the one or more processors 710 may support parallel processing and/or multi-threaded operation, the communication interface 712 may have a persistent communication connection, and the one or more signal lines 722 may constitute a communication bus. Moreover, the user interface 714 may include a display 716, a keyboard 718, and/or a pointer 720, such as a mouse.

Memory 724 in computer system 700 may include volatile memory and/or non-volatile memory. More specifically, memory 724 may include ROM, RAM, EPROM, EEPROM, FLASH, one or more smart cards, one or more magnetic disc storage devices, and/or one or more optical storage devices. Memory 724 may store an operating system 726 that includes procedures (or a set of instructions) for handling various basic system services for performing hardware dependent tasks. The memory 724 may also store procedures (or a set of instructions) in a communication module 728. The communication procedures may be used for communicating with one or more computers and/or servers, including computers and/or servers that are remotely located with respect to the computer system 700.

Memory 724 may also include multiple program modules (or sets of instructions), including: a reconstruction module 730 (or a set of instructions) to determine reconstructed images (such as post-processing images 746), a lithography module 732 (or a set of instructions) to simulate a photo-lithographic process, a defect (or feature) identification module 734 (or a set of instructions) to identify defects 764 in reconstructed images, and/or a qualification module 736 (or a set of instructions) to determine an acceptance condition of one or more photo-masks and/or patterned wafers. The acceptance condition may be based on one or more acceptance criteria 740 (such as a number, type, and/or severity of defects 764). Note that one or more of these program modules (or sets of instructions) may constitute a computer-program mechanism.

Furthermore, memory 724 may include pre-processing images 742 and post-processing images 746, i.e., images before and after reconstruction. Reconstruction module 730 and/or lithography module 732 may utilize one or more stored models of optical paths 748 in photo-lithographic systems and/or optical-inspection devices. In some embodiments, reconstruction module 730 may utilize optionally stored weights 744.

Memory 724 may include target mask patterns 750 and/or circuit patterns 756 (i.e., target wafer patterns). Reconstruction module 730 may utilize one or more of these target patterns when reconstructing pre-processing images 742 corresponding to photo-masks and/or patterned wafers. In addition, memory 724 may include estimated mask patterns 752 and/or estimated circuit patterns 758. Lithography module 732 may utilize estimated mask patterns 752 (which correspond to post-processing images 746) to determine estimated circuit patterns 758.

Memory 724 may also include process window(s) 754 corresponding to estimated mask patterns 752, pre-defined defects 760, statistics 762 corresponding to pre-defined defects 760, and/or rankings 766 of the identified defects 764. Moreover qualification module 736 may determine the acceptance condition of one or more photo-masks and/or patterned wafers based on one or more of these items, as well as the defects 764.

Instructions in the various modules in the memory 724 may be implemented in a high-level procedural language, an object-oriented programming language, and/or in an assembly or machine language. The programming language may be compiled or interpreted, i.e., configurable or configured to be executed by the one or more processors 710.

In some embodiments, at least some of the information in memory 724 is encrypted. For example, lithographic module 732 and/or its output files (i.e., estimated circuit patterns 756) may be encrypted so that integrated-circuit manufacturers are more willing to share this information with photo-mask shops (where photo-mask inspection may be performed).

In some embodiments, the photo-mask shop may send the photo-mask images (i.e., inspection images) to integrated-circuit manufacturers or another third party, who may perform wafer-pattern simulations for one or more devices and/or may determine photo-mask acceptance. Thus, at least a portion of the image processing and inspection technique described may be implemented at a remote location. For example, in embodiments where photo-mask acceptance is fully automated, a system such as that illustrated by computer system 700 may be installed at the integrated-circuit manufacturer. Then, images sent by the photo-mask shop may be processed without exposing the details of the integrated-circuit manufacturing process to the photo-mask maker and, at the same time, without exposing the photo-mask shop to the human judgment of the integrated-circuit manufacturer in accepting or rejecting photo-masks. Alternatively, the photo-mask shop may calculate the reconstructed mask image based on the measurements from the photo-mask-inspection device. This reconstructed mask image may then be sent to the integrated-circuit manufacturer, where simulations of wafer patterns under various process conditions may be performed. The results may be sent back to the photo-mask shop, where they may be used to determine the disposition of potential defects (i.e., whether or not the photo-mask is acceptable). Therefore, the embodiments of the system and method described herein may be implemented by the photo-mask shop and/or by the integrated-circuit manufacturer.

Although the computer system 700 is illustrated as having a number of discrete items, FIG. 7 is intended to be a functional description of the various features that may be present in the computer system 700 rather than as a structural schematic of the embodiments described herein. In practice, and as recognized by those of ordinary skill in the art, the functions of the computer system 700 may be distributed over a large number of servers or computers, with various groups of the servers or computers performing particular subsets of the functions. In some embodiments, some or all of the functionality of the computer system 700 may be implemented in one or more ASICs, one or more field programmable gate arrays (FPGAs), and/or one or more digital signal processors (DSPs).

In some embodiments, the inspection technique and/or the associated image processing may be implemented as a stand-alone software application, or as a program module or sub-routine in another application, such as photo-mask and/or wafer inspection software. Furthermore, the software may be configured to execute on a client or local computer, such as: a personal computer, a laptop computer, or other device capable of manipulating computer readable data, or between two or more computing systems over a network (such as the Internet, World Wide Web or WWW, Intranet, LAN, WAN, MAN, or combination of networks, or other technology enabling communication between computing systems). Therefore, information used when determining images may be stored locally (for example, on the local computer) and/or remotely (for example, on a computer or server that is accessed via a network).

Photo-mask inspection system 200 (FIG. 2A), photo-mask inspection system 230 (FIG. 2B), photo-mask inspection system 250 (FIG. 2C), and/or computer system 700 may include fewer components or additional components, two or more components may be combined into a single component, and/or a position of one or more components may be changed. In some embodiments the functionality of the computer system 700 may be implemented more in hardware and less in software, or less in hardware and more in software, as is known in the art.

Note that the preceding embodiments may be used with chromium-on-glass photo-masks, alternating phase-shifting photo-masks, attenuating phase-shifting photo-masks, and/or multiple-exposure photo-masks (i.e., where patterns printed using two or more photo-masks are combined to produce a desired pattern).

Furthermore, in some embodiments acceptance of a photo-mask and/or a patterned wafer may be fully automated, while in other embodiments it may not be fully automated. Thus, information may be presented to a user, who may verify an acceptance recommendation made by computer system 700 or who may independently determine whether or not to accept the photo-mask and/or the patterned wafer. For example, if a confidence metric for the photo-mask or the patterned wafer is less than a pre-determined value (such as when there are two very different reconstructed images that each correspond to a similar value of the error function H), the user may be consulted to make a final decision or judgment. In these embodiments, a ranking (such as a top-N list) of at least the subset of identified defects may be presented to the user. This ranking may indicate which features or defects are deemed to be the most serious using comparisons of: simulated wafer images and target wafer patterns, comparisons of simulated wafer images that are determined using an estimated photo-mask (corresponding to the reconstructed photo-mask image) and the target mask pattern, comparisons of reconstructed images and target wafer patterns or target mask patterns, a pre-determined set of defects (such as known defects having pre-determined sizes and/or phases), and/or statistics for the pre-determined set of defects (such as their probabilities of occurrence). The user may observe the borderline cases. To assist the user in this process, in some embodiments reconstructed images and/or simulated wafer images may also be presented to the user. This approach may allow the user to identify real defects that result in reduced process windows and lower yield at the wafer level, while ignoring false defects that may cause the mask shop to erroneously scrap or rework good photo-masks, or the integrated-circuit manufacturer to discard a patterned wafer.

Figure 8:
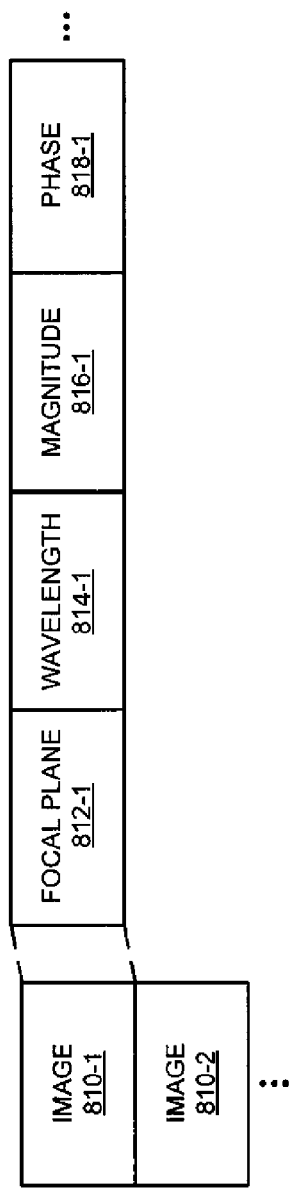
FIG. 8 is a block diagram illustrating an image data structure in accordance with an embodiment of the present disclosure.

We now discuss data structures that may be used in the computer system 700 (FIG. 7). FIG. 8 provides a block diagram illustrating an image data structure 800. This data structure may include information corresponding to one or more images 810. For a given image, such as image 810-1, data structure 800 may include: a focal plane or focus condition 812-1 at which the image was acquired, a wavelength at which the image was measured 814-1, magnitude 816-1 and/or phase 818-1 information.

Figure 9:
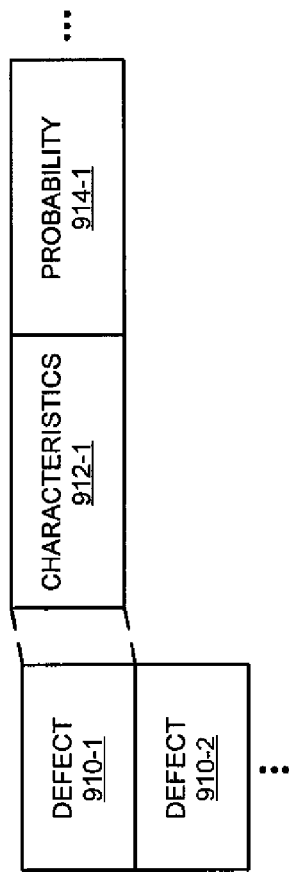
FIG. 9 is a block diagram illustrating a defect data structure in accordance with an embodiment of the present disclosure.

FIG. 9 provides a block diagram illustrating a defect data structure 900. This data structure may include information corresponding to one or more pre-defined defects 910. For a given defect, such as defect 910-1, data structure 900 may include: characteristics 912-1 of defect 910-1 and/or an associated probability 914-1 of occurrence.

Note that in some embodiments of data structures 800 and/or 900 there may be fewer or additional components, two or more components may be combined into a single component, and/or a position of one or more components is changed. For example, data structure 800 may include information about the type of illumination (such as disk, point, annulus, sigmas, etc.) and/or details of the optics (such as one or more wavelengths used or the numerical aperture).

While the preceding discussion has focused on techniques for inspecting photo-masks and/or patterned wafers, these techniques may also be used during metrology, such as process development, process characterization, and/or process monitoring. For example, a calculation (such as an inverse optical calculation) may be used to de-convolve the effect on an image of an optical path in a metrology device. Note that in some embodiments the optical path includes immersion optics. Thus, one or more of the techniques described previously may be used to enhance the resolution, recover additional information (such as spatial frequencies) and/or increase the FOV in an image of a patterned wafer and/or a photo-mask.

Note that these techniques may allow faster, cheaper, and/or non-destructive measurements. For example, CDs on a patterned wafer may be determined using an optical microscope (as opposed to a scanning electron microscope). These CDs may be used to calibrate design tools or modules (such as those for optical proximity correction) and/or manufacturing processes. Moreover, these image-processing techniques may be applied to measurements of isolated features (such as a line) and/or two-dimensional images.

In some embodiments, the image-processing techniques are used for disposition analysis and/or defect review during development (as opposed to the defect inspection and review embodiments described previously).

Moreover, while the preceding discussion has used patterned wafers and photo-masks as illustrative examples, the image-processing techniques may be used in a wide variety of imaging and/or measurement applications which are based on wave phenomena propagating in different types of media (such as electromagnetic waves and sound waves) and at different ranges of wavelengths (such as audio, radio, microwave, infrared, visible, ultra violet, and x-ray).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a disposition of a possible defect in a photo-mask, comprising:
   receiving a first image of a first region around the possible defect in the photo-mask, wherein the photo-mask corresponds to a target mask pattern;
   generating, via the computer, a second image based on the first image to extend the field of view of a measurement device that acquired the first image, wherein the second image includes the first region and a second region surrounding the first region, and wherein the second region is based on the target mask pattern;
   calculating a simulated mask pattern based on the second image using an inverse optical calculation in which the second image is at an image plane in a model of an optical system and the simulated mask pattern is at an object plane in the model of the optical system, wherein the second region in the second image reduces optical proximity effects in the simulated mask pattern associated with a boundary of the first region;
   simulating a wafer pattern in a photo-lithographic process based on the simulated mask pattern; and
   determining the disposition of the possible defect based on the simulated wafer pattern and a target wafer pattern.

2. The method of claim 1, wherein generating the second region in the second image involves filtering a portion of the target mask pattern based on an optical transfer function associated with the optical system; and
   wherein, if needed, generating the second region in the second image involves averaging information in the first region in the first image with information in the second region at a boundary between the first region and the second region.

3. The method of claim 1, wherein the optical system includes a photo-mask inspection system.

4. The method of claim 1, wherein simulating the wafer pattern involves a forward optical calculation in which the simulated mask pattern is at an object plane in a model of a photo-lithographic system and the simulated wafer pattern is at an image plane in the model of the photo-lithographic system.

5. The method of claim 4, wherein simulating the wafer pattern involves simulating development of a photo-resist.

6. The method of claim 1, wherein determining the disposition involves comparing the simulated wafer pattern and the target wafer pattern.

7. The method of claim 6, wherein determining the disposition involves identifying whether or not the possible defect is an actual defect based on the comparison.

8. The method of claim 1, wherein determining the disposition involves calculating a manufacturing yield associated with the photo-mask.

9. The method of claim 1, wherein determining the disposition involves calculating a process window associated with the photo-mask.

10. The method of claim 1, wherein the first image includes information associated with a transmission imaging mode in the optical system.

11. A computer-program product for use in conjunction with a computer system, the computer-program product comprising a non-transitory computer-readable storage medium and a computer-program mechanism embedded therein for determining a disposition of a possible defect in a photo-mask, the computer-program mechanism including:
   instructions for receiving a first image of a first region around the possible defect in the photo-mask, wherein the photo-mask corresponds to a target mask pattern;
   instructions for generating a second image based on the first image to extend the field of view of a measurement device that acquired the first image, wherein the second image includes the first region and a second region surrounding the first region, and wherein the second region is based on the target mask pattern;
   instructions for calculating a simulated mask pattern based on the second image using an inverse optical calculation in which the second image is at an image plane in a model of an optical system and the simulated mask pattern is at an object plane in the model of the optical system, wherein the second region in the second image reduces optical proximity effects in the simulated mask pattern associated with a boundary of the first region;
   instructions for simulating a wafer pattern in a photo-lithographic process based on the simulated mask pattern; and
   instructions for determining the disposition of the possible defect based on the simulated wafer pattern and a target wafer pattern.

12. The computer-program product of claim 11, wherein generating the second region in the second image involves filtering a portion of the target mask pattern based on an optical transfer function associated with the optical system; and
   wherein, if needed, generating the second region in the second image involves averaging information in the first region in the first image with information in the second region at a boundary between the first region and the second region.

13. The computer-program product of claim 11, wherein the optical system includes a photo-mask inspection system.

14. The computer-program product of claim 11, wherein simulating the wafer pattern involves a forward optical calculation in which the simulated mask pattern is at an object plane in a model of a photo-lithographic system and the simulated wafer pattern is at an image plane in the model of the photo-lithographic system.

15. The computer-program product of claim 11, wherein determining the disposition involves comparing the simulated wafer pattern and the target wafer pattern.

16. The computer-program product of claim 15, wherein determining the disposition involves identifying whether or not the possible defect is an actual defect based on the comparison.

17. The computer-program product of claim 11, wherein determining the disposition involves calculating a manufacturing yield associated with the photo-mask.

18. The computer-program product of claim 11, wherein determining the disposition involves calculating a process window associated with the photo-mask.

19. The computer-program product of claim 11, wherein the first image includes information associated with a transmission imaging mode in the optical system.

20. A computer system, comprising:

at least one processor;

at least one memory; and at least one program module, the program module stored in the memory and configured to be executed by the processor to determine a disposition of a possible defect in a photo-mask, the program module including:

instructions for receiving a first image of a first region around the possible defect in the photo-mask, wherein the photo-mask corresponds to a target mask pattern;

instructions for generating a second image based on the first image to extend the field of view of a measurement device that acquired the first image, wherein the second image includes the first region and a second region surrounding the first region, and wherein the second region is based on the target mask pattern;

instructions for calculating a simulated mask pattern based on the second image using an inverse optical calculation in which the second image is at an image plane in a model of an optical system and the simulated mask pattern is at an object plane in the model of the optical system, wherein the second region in the second image reduces optical proximity effects in the simulated mask pattern associated with a boundary of the first region;

instructions for simulating a wafer pattern in a photolithographic process based on the simulated mask pattern; and instructions for determining the disposition of the possible defect based on the simulated wafer pattern and a target wafer pattern.

* * * * *